United States Patent
Arvelo et al.

(10) Patent No.: US 9,453,972 B1
(45) Date of Patent: Sep. 27, 2016

(54) PLUGGABLE MODULE FOR HEAT REMOVAL DEVICE

(71) Applicant: International Business Machines Corporation, Armonk, NY (US)

(72) Inventors: Amilcar R. Arvelo, Poughkeepsie, NY (US); Alan F. Benner, Poughkeepsie, NY (US); Michael J. Ellsworth, Poughkeepsie, NY (US); David P. Graybill, Staatsburg, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/733,419

(22) Filed: Jun. 8, 2015

(51) Int. Cl.
*G02B 6/00* (2006.01)
*G02B 6/38* (2006.01)
*H01R 13/66* (2006.01)
*H05K 7/20* (2006.01)

(52) U.S. Cl.
CPC ........... *G02B 6/3814* (2013.01); *G02B 6/3825* (2013.01); *H01R 13/6608* (2013.01); *H05K 7/20409* (2013.01)

(58) Field of Classification Search
CPC .............. G02B 6/3814; G02B 6/3825; H01R 13/6608; H05K 7/20409
USPC ............................ 385/53, 139; 398/135–139
See application file for complete search history.

(56) References Cited

U.S. PATENT DOCUMENTS

| | | | |
|---|---|---|---|
| 7,260,303 B2 | 8/2007 | Bench et al. | |
| 7,371,965 B2 | 5/2008 | Ice | |
| 8,035,973 B2 | 10/2011 | McColloch | |
| 8,081,470 B2* | 12/2011 | Oki | G02B 6/4201 165/185 |
| 8,345,445 B2 | 1/2013 | Del Prete et al. | |
| 8,449,203 B2 | 5/2013 | Downs | |
| 8,760,870 B2* | 6/2014 | Yamamoto | G02B 6/4201 165/80.2 |
| 8,911,244 B2* | 12/2014 | Elison | H05K 7/20454 439/137 |
| 2003/0169983 A1* | 9/2003 | Branch | G02B 6/4201 385/92 |

(Continued)

FOREIGN PATENT DOCUMENTS

JP 2010085805 A 4/2010

*Primary Examiner* — Thomas A Hollweg
*Assistant Examiner* — Guy Anderson
(74) *Attorney, Agent, or Firm* — Cantor Colburn LLP; Margaret McNamara

(57) ABSTRACT

A pluggable module is provided and includes a plug receptacle in which a plug is receivable, a housing coupled to the plug receptacle, a heat removal device partially disposable within the housing to assume and be movable between first and second positions and an armature. The armature is interposed between corresponding portions of the housing and the heat removal device and is configured for selective manipulation to thereby move the heat removal device from the second position to the first position. With the plug received in the plug receptacle and the heat removal device in the first position, the heat removal device forms a thermal pathway with the plug by which heat is removed from the plug.

18 Claims, 6 Drawing Sheets

(56) References Cited

U.S. PATENT DOCUMENTS

| | | | |
|---|---|---|---|
| 2005/0088406 A1* | 4/2005 | Chang | G06F 3/045 345/156 |
| 2005/0220425 A1* | 10/2005 | Kropp | G02B 6/4292 385/88 |
| 2006/0176666 A1* | 8/2006 | Saturley | G06F 1/20 361/679.46 |
| 2009/0296351 A1* | 12/2009 | Oki | G02B 6/4246 361/709 |
| 2010/0067196 A1* | 3/2010 | Costello | H05K 5/0286 361/704 |
| 2012/0052720 A1* | 3/2012 | David | H01R 13/6595 439/487 |
| 2012/0300407 A1* | 11/2012 | Yamamoto | G02B 6/4201 361/715 |
| 2013/0033821 A1 | 2/2013 | Szczesny et al. | |
| 2013/0077253 A1 | 3/2013 | Macall | |
| 2015/0092354 A1* | 4/2015 | Kelty | H05K 7/20563 361/722 |

* cited by examiner

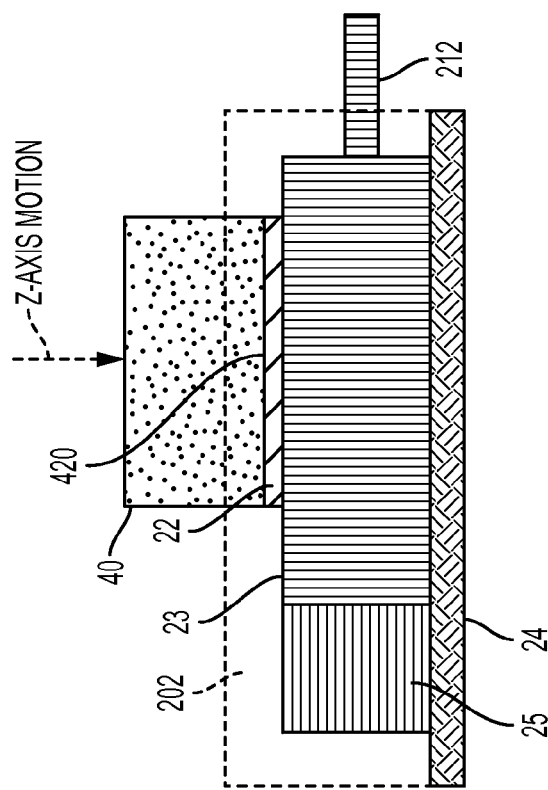
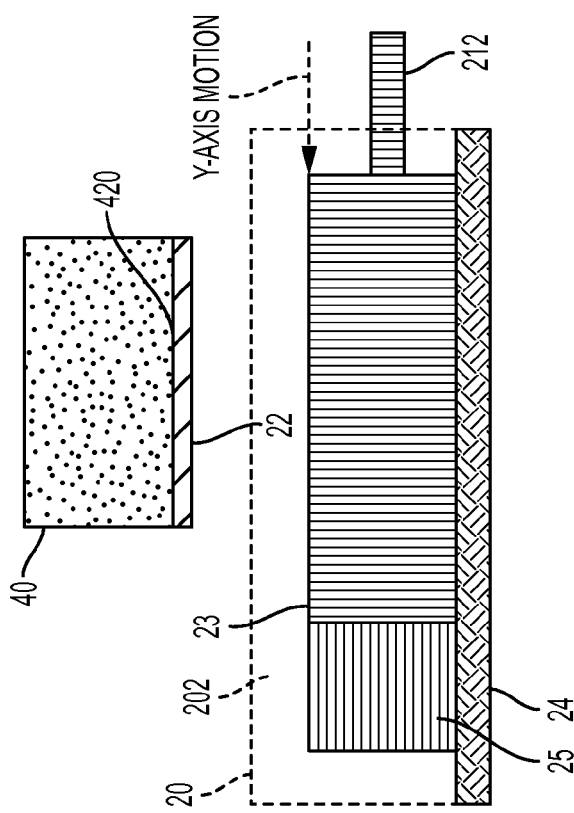
FIG. 2A
FIG. 2B

PLUGGABLE MODULE FOR HEAT REMOVAL DEVICE

BACKGROUND

The present invention relates to a pluggable module and, more specifically, to a pluggable module for a high performance heat removal device interface assembly.

In optical data transmission for servers, switches and other equipment, the physical design of the optical transceivers has generally been a challenge since heat often needs to be effectively removed from the transceiver to extend laser lifetime without sacrificing interface performance.

An optical transmitter, receiver or transceiver typically has three basic interface types. They include electrical inputs/outputs (I/Os) for power and data transmission or reception, optical I/Os for transmitted or received data and a thermal interface for removing heat generated in the device. In modern, high-performance optical transceivers, each of these three interfaces may be pushed near to their technical limits where, for example, the electrical and optical interfaces operate at bit rates of 25 Gb/s and faster, with very low loss and very good signal integrity, and with the thermal interface removing enough heat to keep the optical transceiver at a moderate temperature improve long-term reliability. Indeed, lasers are sensitive to heat and will degrade and fail quickly if allowed to operate at elevated temperatures.

Technical challenges of all these interfaces are made more difficult due to the fact that, for long-term overall system-level reliability and upgradability, optical transceivers frequently need to be "hot pluggable," which means that it must be possible to easily insert or remove them while a corresponding system is in operation. Previously, this has been achieved by the development of "small form-factor pluggable" (SFP) mechanical designs for transceivers and cable connectors. These modules incorporate good, high-speed electrical connectors, and are large and physically robust enough to house optical transmitter and optical receiver components (e.g., lasers and photodiodes) along with interface electronics and management electronics.

However, the mechanical interfaces for cooling of these modules are generally not well optimized. Optimized cooling of an optical transceiver module requires very close contact with a heat sink, through a thermal interface material (TIM) with high heat conductivity and good conformance to the module. In the SFP designs, a design for a high performance heat sink that provides excellent heat removal while also preserving easy hot-pluggability of the devices or cables is not yet available.

SUMMARY

According to one embodiment of the present invention, a pluggable module is provided and includes a plug receptacle in which a plug is receivable, a housing coupled to the plug receptacle, a heat removal device partially disposable within the housing to assume and be movable between first and second positions and an armature. The armature is interposed between corresponding portions of the housing and the heat removal device and is configured for selective manipulation to thereby move the heat removal device from the second position to the first position. With the plug received in the plug receptacle and the heat removal device in the first position, the heat removal device forms a thermal pathway with the plug by which heat is removed from the plug.

According to another embodiment, a pluggable module is provided and includes a plug receptacle in which a plug is receivable, a housing coupled to the plug receptacle, a heat removal device partially disposable within the housing to assume and be movable between first and second positions and an armature. The armature is interposed between corresponding portions of the housing and the heat removal device and configured for selective manipulation urging armature movement in first or second opposite directions to thereby move the heat removal device from the second position to the first position and vice versa, respectively. With the plug received in the plug receptacle and the heat removal device in the first position, the heat removal device forms a thermal pathway with the plug by which heat is removed from the plug.

According to another embodiment, a pluggable module is provided and includes a plug receptacle in which a plug is receivable, a housing coupled to the plug receptacle, a heat removal device partially disposable within the housing to assume and be movable between first and second positions and an armature. The armature is interposed between corresponding portions of the housing and the heat removal device and configured for selective manipulation urging armature movement in first or second opposite directions and in third or fourth opposite directions to thereby move the heat removal device from the second position to the first position and vice versa, respectively. With the plug received in the plug receptacle and the heat removal device in the first position, the heat removal device forms a thermal pathway with the plug by which heat is removed from the plug.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2A is a side schematic view of a portion of a plug being inserted into a position proximate to a passive heat sink of the pluggable module;

FIG. 2B is a side schematic view of the passive heat sink being brought down to the portion of the plug of FIG. 2A;

DETAILED DESCRIPTION

Figure 1:
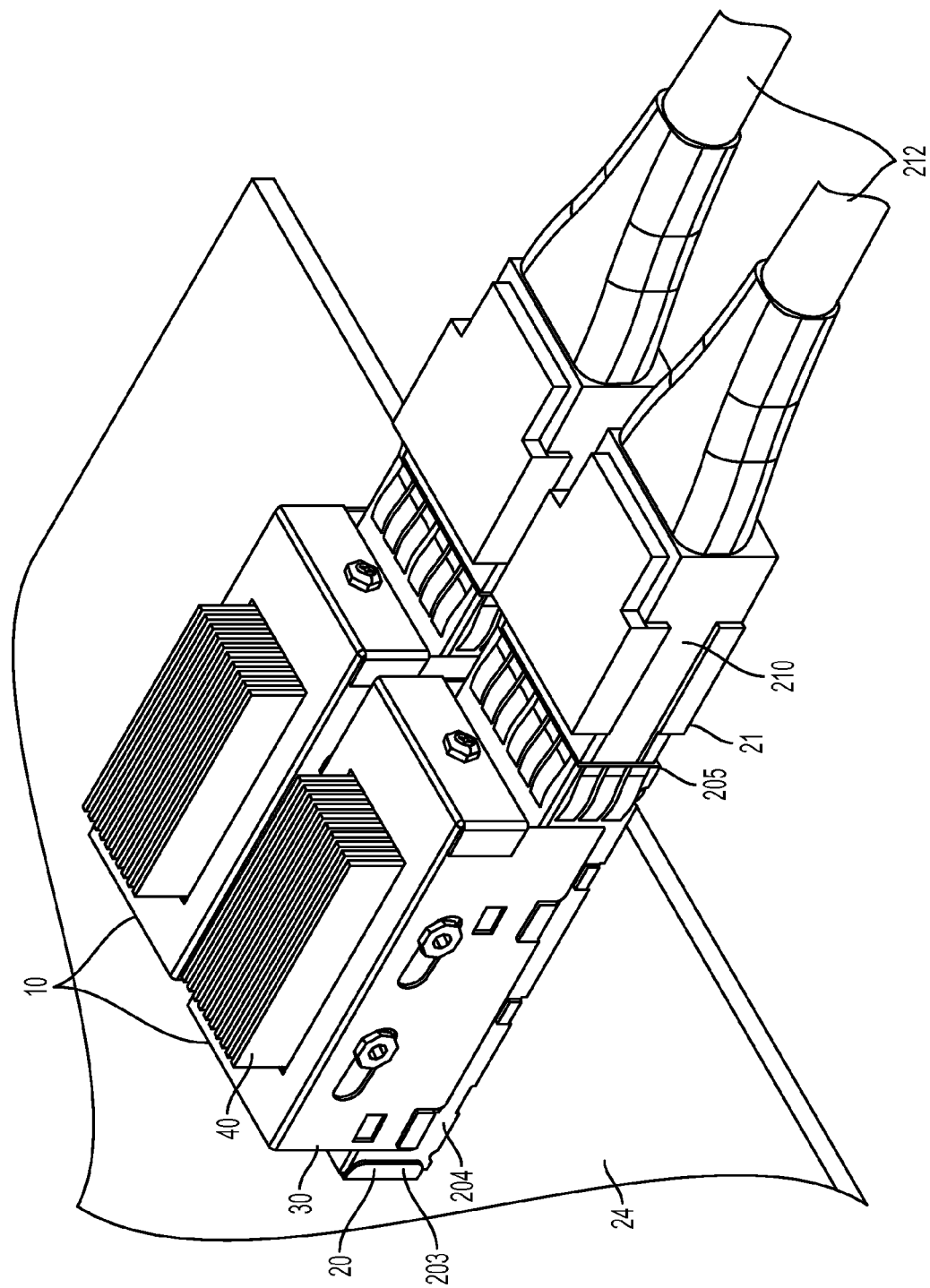
FIG. 1 is a perspective view of a pluggable module for a high performance passive heat sink interface assembly in accordance with embodiments.

As will be described below, an optical transceiver or active cables with optical transceivers embedded in the cables may be inserted into a cage/receptacle to thereby contact a high-speed electrical connector using a "y-axis" motion (i.e., an insertion direction motion directed into the receptacle in the host board. Then, as a separate operation, an actuating screw is turned, which translates into vertical ("z-axis") motion of a heat removal device. This action brings the heat removal device down directly onto the heat transfer surface of the optical transceiver. Since a screw controls the z-axis motion of the heat removal device, the screw can exert a well-controlled vertical force onto the heat removal device and the optical transceiver to thereby push these components together through a thin, potentially-fragile high-performance thermal interface material (TIM) without damaging the TIM. If the transceiver must be removed, the screw is loosened to raise the heat removal device/TIM assembly away from the transceiver, and the transceiver can be easily pulled out again, without damaging the TIM.

The heat removal device may be provided as any one or more of a passive heat sink, an active heat sink and a cold plate. Each alternative may be provided as a plurality of devices, is interchangeable with the others and may be employed jointly with or separately from the others. However, for purposes of clarity and brevity, in the following description, the heat removal device is shown and described as a passive heat sink with reference to FIGS. 1-5, as an active heat sink with reference to FIG. 6 and as a cold plate with reference to FIG. 7.

With reference to FIGS. 1, 2A, 2B and 3, a pluggable module 10 is provided for use with a high performance passive heat sink interface assembly. The pluggable module includes a plug receptacle 20 in which a plug 21 is receivable, a housing 30 that is coupled to the plug receptacle 20, a passive heat sink 40 and an armature 50. The passive heat sink 40 is partially disposable within the housing 30 to assume and be movable between first and second positions. The armature 50 is interposed between corresponding portions of the housing 30 and the passive heat sink 40 and is configured for selective manipulation. This selective manipulation of the armature 50 has the effect of urging a movement of the armature 50 in first or second opposite directions illustrated by the arrow in FIG. 3.

Such movement of the armature 50 causes movement in turn of the passive heat sink 40 from the second position to the first position and vice versa, respectively. With the plug 21 received in the plug receptacle 20 and the passive heat sink 40 moved into the second position, the passive heat sink 40 thus forms a thermal pathway with the plug 21 by which heat is removed from the plug 21. That is, with the plug 21 received in the plug receptacle 20 and the passive heat sink 40 moved into the second position, a thermal interface material (TIM) 22 disposed on a bottom surface of the passive heat sink 40 (i.e., a TIM-contacting surface 420, which will be described further below) contacts a surface 23 of the plug 21 and thereby removes heat from the plug 21 through the TIM 22 along this thermal pathway.

The TIM 22 may be provided as a thin, potentially-fragile high-performance TIM 22. Also, the TIM 22 may be provided as a one-sided aluminized indium or elastomer pad. In the former case, the TIM 22 can be attached to the bottom surface of the passive heat sink 40 via microgrooves on the bottom surface whereas, in the latter case, the elastomer pad can be glued to the bottom surface.

The plug receptacle 20 is shown in FIG. 1 as being adjacent to another plug receptacle 20 in an assembly in which both plug receptacles 20 are supportively disposed on a card 24. Each plug receptacle 20 may be provided as a high-speed electrical connector and includes a rectangular housing 201 that is formed to define an interior 202 with a closed end 203, sidewalls 204 and an opening 205 through which the plug 21 may be inserted. Each plug receptacle 20 may further include electrical or optical connector elements (e.g., electrical I/Os and optical I/Os) 25 within the interiors 202.

The plug 21 may be provided with a small form factor pluggable (SFP) design in the mold of any one or more of QSFP+, SFP+, CXP+ and CDFP+. In any case, the plug 21 is operably attached to an end of cable 212, which may be an optical or electrical cable. The plug 21 is shown in FIG. 1 as being provided as a pair with each plug receptacle 20 including a plug housing 210 that is shaped to fit in the interior 202 of a corresponding one of the plug receptacles 20 and a housing opening 205. As shown in FIG. 2A, the plug 21 may be inserted into the plug housing 210 using the above-noted y-axis motion, which is defined along the Y-axis illustrated by the arrow in FIG. 2A.

The passive heat sink 40 includes a first, upper portion 41 and a second, lower portion 42. The first, upper portion 41 includes passive heat transfer fins 410 by which heat removed from the plug 21 may be dissipated. The second, lower portion 42 includes the TIM-contacting surface 420 and is formed to define pairs of angled guide grooves 421 on either side of the passive heat sink 40. The housing 30 includes first and second lateral sidewalls 31 that are respectively formed to define non-angled guide grooves 310, a longitudinal end wall 32 and an upper surface 33. The longitudinal end wall 32 extends between the sidewalls 31 and is formed to define a circular through-hole 320 through which the armature 50 may be selectively manipulated as will be described below. The upper surface 33 extends between the sidewalls 31 and is formed to define an aperture 330 through which at least the first, upper portion 41 of the passive heat sink 40 is extendable.

In accordance with embodiments, the aperture 330 may have a same length as the passive heat sink 40. As such, the passive heat sink 40 cannot move relative to the housing 30 in the first or second opposite directions illustrated by the arrow in FIG. 3. In accordance with alternative embodiments, the aperture 330 may be longer than the passive heat sink 40 but, in such cases, an additional feature would be disposed between a longitudinal end of the passive heat sink 40 and the corresponding edge of the upper surface 33 to insure that the passive heat sink 40 cannot move relative to the housing 30 in the first or second opposite directions illustrated by the arrow in FIG. 3.

The armature 50 may be U-shaped and includes a main member 51 and first and second lateral legs 52 that extend in parallel with one another from opposite distal ends of the main member 51. The main member 51 is formed to define a threaded hole 510 and each of the first and second lateral legs 52 includes a pair of threaded-holes 520. In addition, though not shown in FIG. 3, the first and second lateral legs 52 each include recesses defined in their respective tips. The armature 50 may further include an armature plate 53 and armature bosses 54. The armature plate 53 is formed to define plate through-holes 530 and is slidably disposable along longitudinal edges of the sidewalls 31. The armature bosses 54 are extendible through the armature plate 53 and into the recesses defined in the respective tips of the first and second lateral legs 52 to provide guided support to the first and second lateral legs 52.

Figure 3:
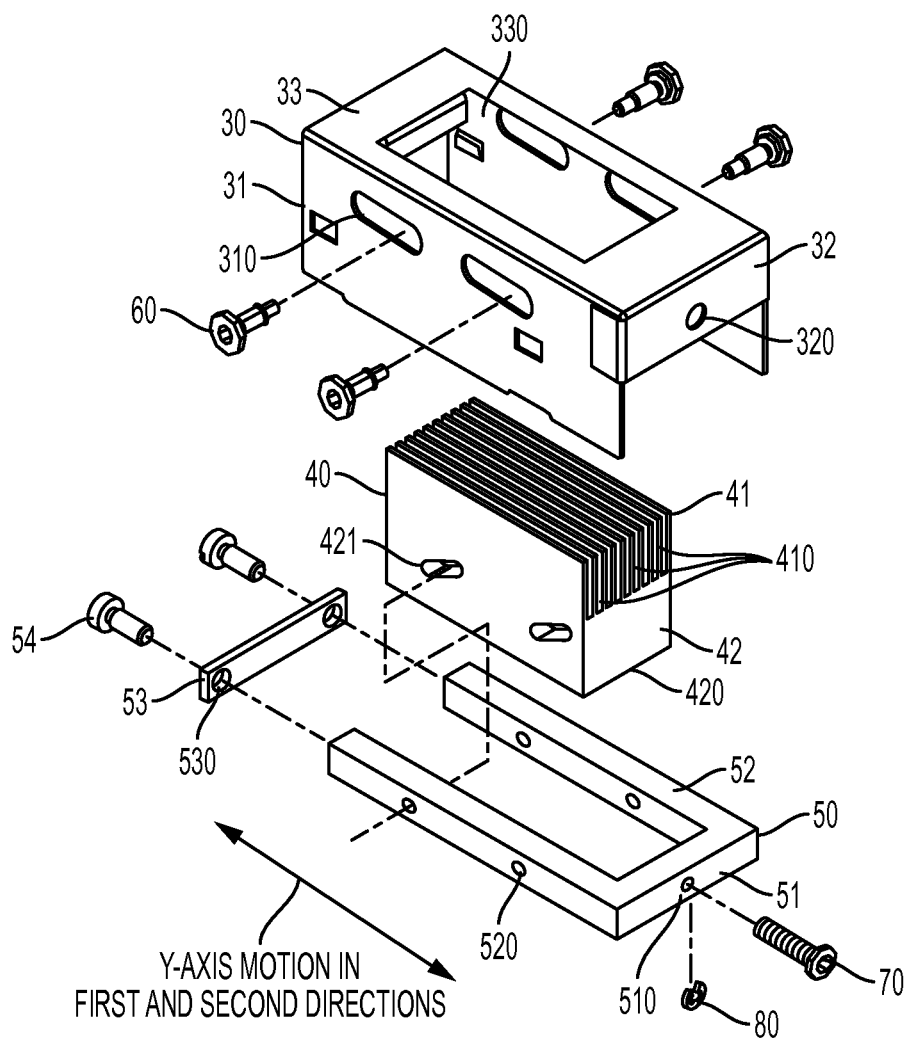
FIG. 3 is an exploded perspective view of components of the pluggable module of FIG. 1.

Still referring to FIG. 3, the pluggable module 10 further includes bosses 60, a screw element 70 and a C-shaped clip element 80. The bosses 60 are extendable through the non-angled guide grooves 310 of the sidewalls 31, through the threaded-holes 520 of the first and second lateral legs 52 of the armature 50 and into the angled guide grooves 421 of the passive heat sink 40. The screw element 70 is rotatably extendable through the circular through-hole 320 and may be axially secured in place by the C-shaped clip element 80. Rotation of the screw element 70 about a longitudinal axis thereof causes threading of the screw element 70 to engage with corresponding threading of the threaded hole 510 to selectively move the armature 50 in the first or second opposite directions illustrated by the arrow in FIG. 3.

With the above-described construction, the movement of the armature 50 in the first direction, causes the armature 50 to approach the longitudinal end wall 32. This, in turn, drags the bosses 60 along the non-angled guide grooves 310 toward the longitudinal end wall 32. However, since the aperture 330 prevents relative movement of the passive heat sink 40 in the first or second opposite directions, the dragging of the bosses 60 generates a downward force on the angled guide grooves 421 of the passive heat sink 40 to thereby force the passive heat sink 40 and the TIM 22 to move along the Z-axis (see FIG. 2B) toward the surface 23 of the plug 21.

Thus, since the eventual contact between the TIM-contacting surface 420 and the surface 23 of the plug 21 is effectively generated as a result of the rotation of the screw element 70, a compressive force applied to the TIM 22 can be well controlled in accordance with the angular rotational force applied to rotate the screw element 70.

Figure 4:
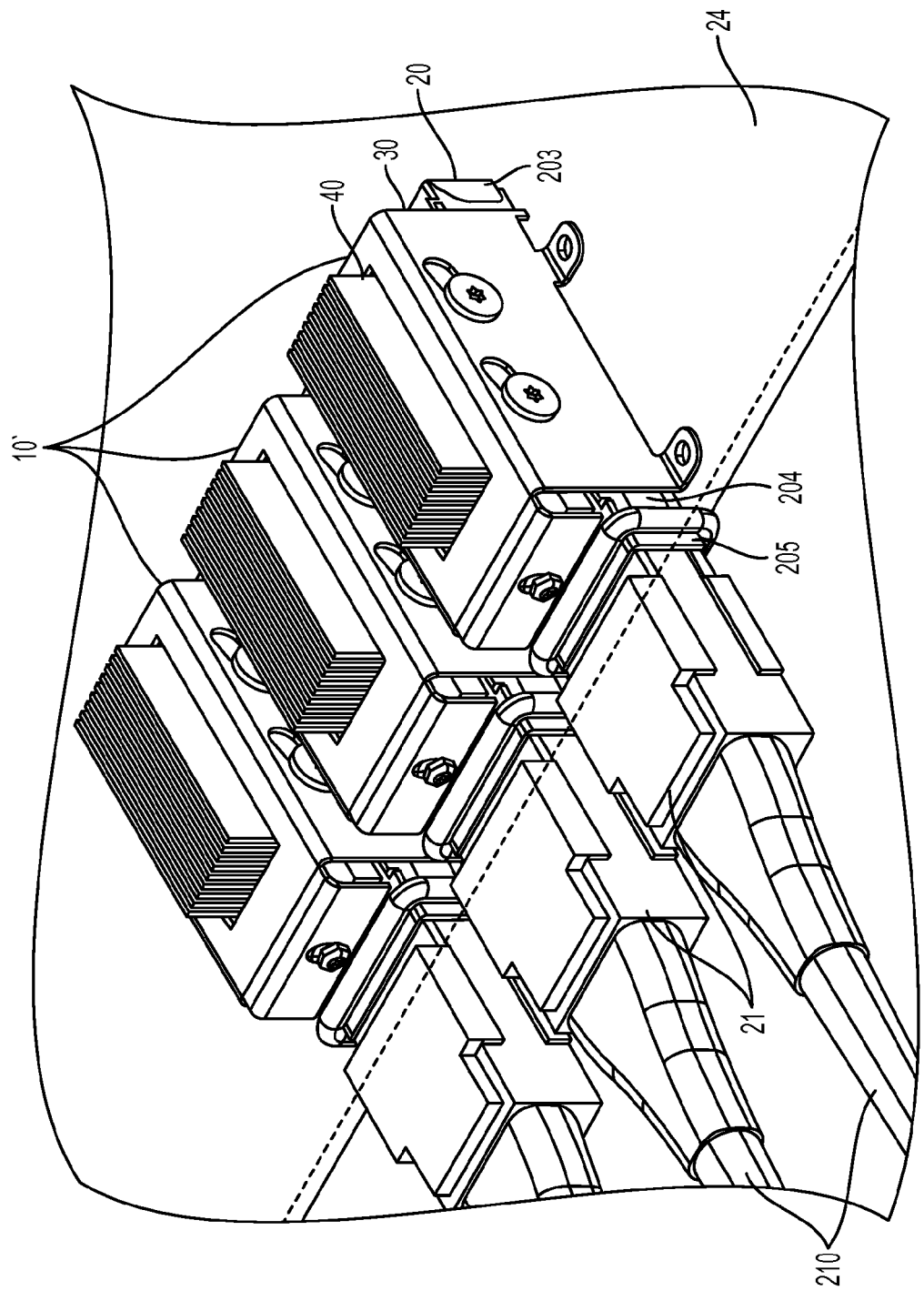
FIG. 4 is a perspective view of a pluggable module for a high performance passive heat sink interface assembly in accordance with alternative embodiments.
Figure 5:
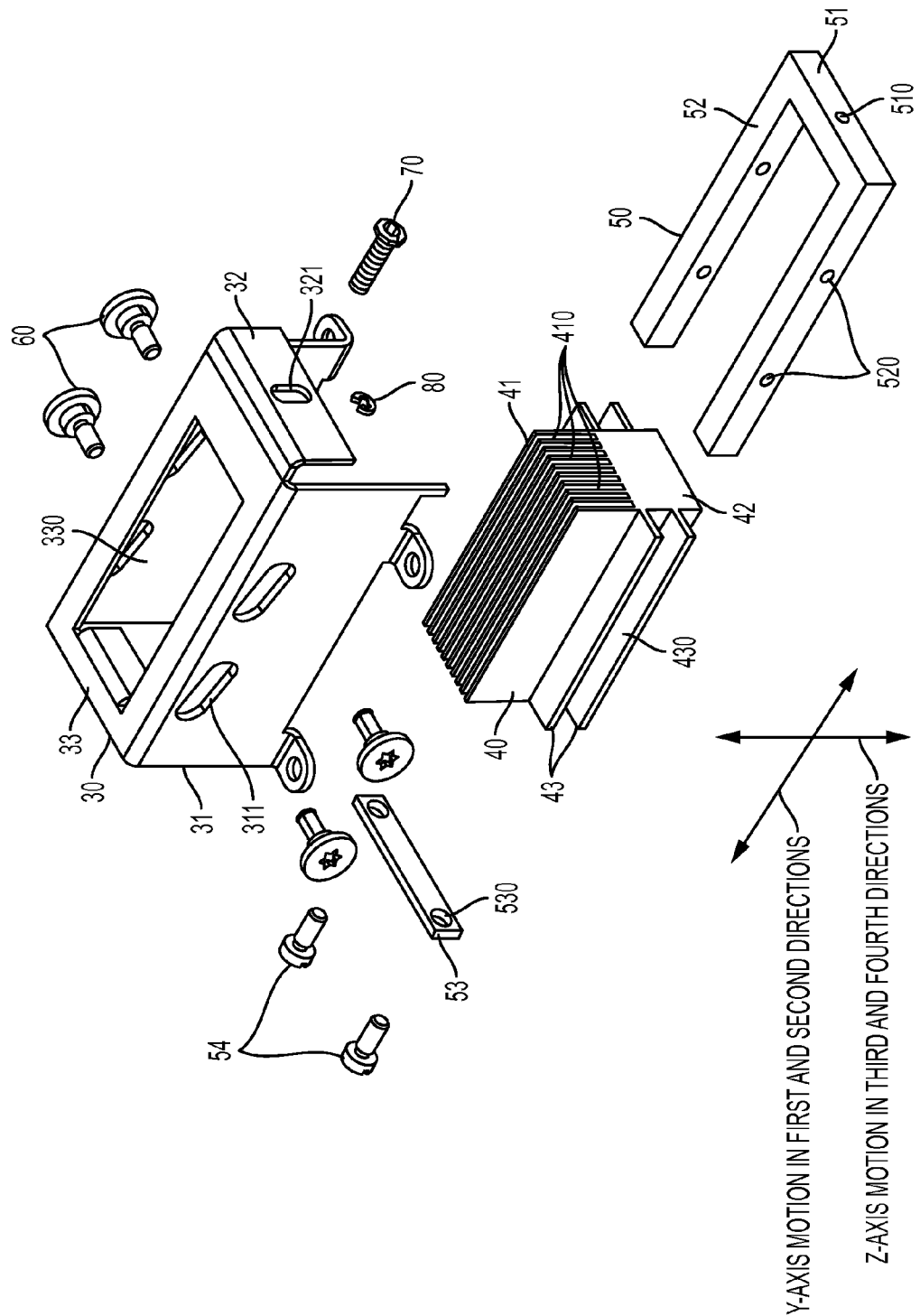
FIG. 5 is an exploded perspective view of components of the pluggable module of FIG. 4.

With reference to FIGS. 4 and 5, a pluggable module 10' is provided for use with a high performance passive heat sink interface assembly. The pluggable module 10' is generally similar in construction and function to the pluggable module 10 described above and descriptions of like features will be omitted from the following description of the pluggable module 10'.

As shown in FIGS. 4 and 5, the armature 50 of the pluggable module 10' is interposed between the corresponding portions of the housing 30 and the passive heat sink 40 and is configured for selective manipulation. Such selective manipulation of the armature 50 urges movement of the armature 50 in first or second opposite directions and in third or fourth opposite directions, as illustrated in FIG. 5. This movement of the armature 50 in turn causes the passive heat sink 40 to move from the second position to the first position and vice versa, respectively.

The passive heat sink 40 of the pluggable module 10' is similar to the passive heat sink 40 described above but is not necessarily formed to define grooves and does include flanges 43. The flanges 43 are provided in pairs on either side of the passive heat sink 40 to form respective longitudinal grooves 430. The first and second legs 52 of the armature 50 fit tightly within these longitudinal grooves 430 such that the flanges 43 are configured to secure the passive heat sink 40 to the armature 50 with respect to movement of the armature 50 in the third or fourth opposite directions. The housing 30 of the pluggable module 10' is also similar to the housing 30 described above but the sidewalls 31 are respectively formed to define angled guide grooves 311 and the longitudinal end wall 32 extends between the sidewalls 31 and is formed to define an elongate through-hole 321.

With the above-described construction of the pluggable module 10', the rotation of the screw element 70 moves the armature 50 in the first direction and causes the armature 50 to approach the longitudinal end wall 32. This, in turn, drags the bosses 60 along the angled guide grooves 311 toward the longitudinal end wall 32 such that the armature 50 recedes from the upper surface 33 owing to the direction of the angling of the angled guide grooves 311. The recession of the armature 50 is permitted by movement of the screw element 70 along the elongate through-holes 321 and sliding movement of the armature plate 53 along the sidewalls 31. Meanwhile, since the aperture 330 prevents relative movement of the passive heat sink 40 in the first or second opposite directions and the first and second legs 52 of the armature 50 fit tightly within the longitudinal grooves 430, the dragging of the bosses 60 generates a downward force on the passive heat sink 40 to thereby force the heat sink 40 and the TIM 22 to move along the Z-axis (see FIG. 2B) toward the surface 23 of the plug 21.

Thus, as above, since the eventual contact between the TIM-contacting surface 420 and the surface 23 of the plug 21 is again effectively generated as a result of the rotation of the screw element 70, a compressive force applied to the TIM 22 can be well controlled in accordance with the angular rotational force applied to rotate the screw element 70.

Figure 6:
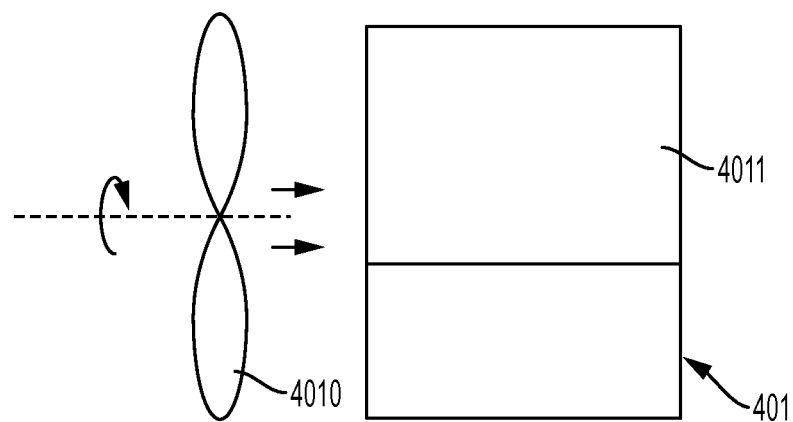
FIG. 6 is a schematic illustration of an active heat sink in accordance with alternative embodiments.
Figure 7:
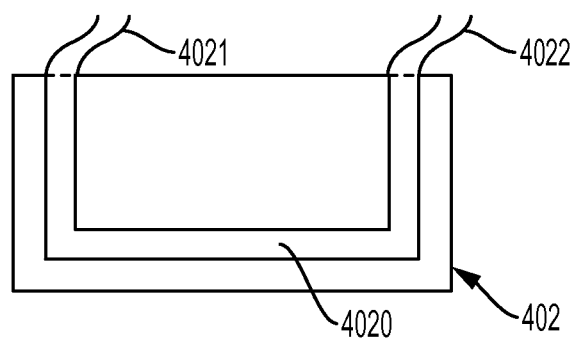
FIG. 7 is a schematic illustration of a cold plate in accordance with alternative embodiments.

With reference to FIGS. 6 and 7, it is to be understood as noted above that the heat removal device may be embodied as one or more active heat sinks 401 and as one or more cold plates 402. In the former case, the active heat sink 401 is generally formed to have similar configurations as that of the passive heat sink 40 described above but may be paired with a fan or blower 4010 that blows cooling air flow over now-active heat transfer fins 4011. In the latter case, the cold plate 402 is generally formed to have similar configurations as that of the passive heat sink 40 described above but is further formed to define a cooling chamber 4020 and is paired with a flexible coolant inlet duct 4021 and a flexible coolant outlet duct 4022. Coolant is thus directed into the cooling chamber 4020 by way of the coolant inlet duct 4021 and drawn out of the cooling chamber 4020 by the coolant outlet duct 4022. The flexibility of the coolant inlet and outlet ducts 4021 and 4022 facilitates continuous coolant flow even during the above described movement (e.g., the z-axis movement) of the cold plate 402.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A pluggable module, comprising:
    a plug receptacle in which a plug is receivable;
    a housing coupled to the plug receptacle;
    a heat removal device comprising heat transfer fins and a plug-contacting surface, the heat removal device being partially disposable within the housing to assume and be movable between first and second positions; and
    an armature interposed between corresponding portions of the housing and the heat removal device and configured for selective manipulation to thereby move the heat removal device from the second position to the first position,
    wherein, with the plug received in the plug receptacle and the heat removal device in the first position, the heat removal device forms a thermal pathway with the plug by which heat is removed from the plug, and
    wherein the housing comprises lateral sidewalls, a longitudinal end wall extending between the sidewalls and defining a through-hole through which the armature is manipulated and an upper surface extending between the sidewalls and defining an aperture through which the heat removal device is extendable.

2. The pluggable module according to claim 1, wherein heat removal device comprises any one or more of a passive heat sink, an active heat sink and a cold plate.

3. The pluggable module according to claim 1, wherein the aperture has a same length as the heat removal device.

4. The pluggable module according to claim 1, wherein the through-hole is circular.

5. The pluggable module according to claim 4, wherein the armature is configured for selective manipulation urging armature movement in first or second opposite directions.

6. The pluggable module according to claim 5, wherein armature movement in the first or second directions causes heat removal device movement toward or away from the first position, respectively.

7. The pluggable module according to claim 1, wherein the through-hole is elongate.

8. The pluggable module according to claim 7, wherein the armature is configured for selective manipulation urging armature movement in first or second opposite direction and in third or fourth opposite directions.

9. The pluggable module according to claim 8, wherein armature movement in the first and third or the second and fourth directions causes heat removal device movement toward or away from the first position, respectively.

10. A pluggable module, comprising:
    a plug receptacle in which a plug is receivable;
    a housing coupled to the plug receptacle;
    a heat removal device comprising a first portion including heat transfer fins and a second portion including a plug-contacting surface and defining angled guide grooves, the heat removal device being partially disposable within the housing to assume and be movable between first and second positions; and
    an armature interposed between corresponding portions of the housing and the heat removal device and configured for selective manipulation urging armature movement in first or second opposite directions to thereby move the heat removal device from the second position to the first position and vice versa, respectively,
    wherein, with the plug received in the plug receptacle and the heat removal device in the first position, the heat removal device forms a thermal pathway with the plug by which heat is removed from the plug, and
    wherein the housing comprises lateral sidewalls respectively defining non-angled guide grooves, a longitudinal end wall extending between the sidewalls and defining a circular through-hole through which the armature is manipulated and an upper surface extending between the sidewalls and defining an aperture through which the heat removal device is extendable.

11. The pluggable module according to claim 10, wherein heat removal device comprises any one or more of a passive heat sink, an active heat sink and a cold plate.

12. The pluggable module according to claim 10, wherein the aperture has a same length as the heat removal device.

13. The pluggable module according to claim 10, further comprising:
    bosses extendable through the non-angled guide grooves, through lateral legs of the armature and into the angled guide grooves; and
    a screw element, which is rotatably extendable through the circular through-hole to selectively manipulate a main member of the armature from which the lateral legs extend.

14. A pluggable module, comprising:
    a plug receptacle in which a plug is receivable;
    a housing coupled to the plug receptacle;
    a heat removal device partially disposable within the housing to assume and be movable between first and second positions; and
    an armature interposed between corresponding portions of the housing and the heat removal device and configured for selective manipulation urging armature movement in first or second opposite directions and in third or fourth opposite directions to thereby move the heat removal device from the second position to the first position and vice versa, respectively,
    wherein, with the plug received in the plug receptacle and the heat removal device in the first position, the heat removal device forms a thermal pathway with the plug by which heat is removed from the plug.

15. The pluggable module according to claim 14, wherein heat removal device comprises any one or more of a passive heat sink, an active heat sink and a cold plate.

16. The pluggable module according to claim 14, wherein the heat removal device comprises a first portion including heat transfer fins and a second portion including a plug-contacting surface and flanges configured to secure the heat removal device to the armature with respect to armature movement in the third or fourth opposite directions and the housing comprises:
    first and second lateral sidewalls respectively formed to define angled guide grooves;
    a longitudinal end wall extending between the sidewalls and formed to define an elongate through-hole through which the armature is selectively manipulated; and
    an upper surface extending between the sidewalls and formed to define an aperture through which the heat removal device is extendable.

17. The pluggable module according to claim 16, wherein the aperture has a same length as the heat removal device.

18. The pluggable module according to claim 16, further comprising:

bosses extendable through the angled guide grooves and into lateral legs of the armature; and a screw element, which is rotatably extendable through the elongate through-hole to selectively manipulate a main member of the armature from which the lateral legs extend.

\* \* \* \* \*